(12) United States Patent
Okabe et al.

(10) Patent No.: US 10,741,635 B2
(45) Date of Patent: Aug. 11, 2020

(54) DISPLAY DEVICE, DISPLAY DEVICE MANUFACTURING METHOD, AND DISPLAY DEVICE MANUFACTURING APPARATUS

(71) Applicant: Sharp Kabushiki Kaisha, Sakai, Osaka (JP)

(72) Inventors: Tohru Okabe, Sakai (JP); Shinsuke Saida, Sakai (JP); Ryosuke Gunji, Sakai (JP); Hiroki Taniyama, Sakai (JP); Shinji Ichikawa, Sakai (JP); Yoshihiro Nakada, Sakai (JP); Hiroharu Jinmura, Sakai (JP); Akira Inoue, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/472,221

(22) PCT Filed: Sep. 28, 2017

(86) PCT No.: PCT/JP2017/035168
§ 371 (c)(1),
(2) Date: Jun. 21, 2019

(87) PCT Pub. No.: WO2019/064409
PCT Pub. Date: Apr. 4, 2019

(65) Prior Publication Data
US 2020/0119123 A1   Apr. 16, 2020

(51) Int. Cl.
*H01L 27/32* (2006.01)
*H01L 51/52* (2006.01)

(52) U.S. Cl.
CPC ...... *H01L 27/3276* (2013.01); *H01L 27/3246* (2013.01); *H01L 51/524* (2013.01)

(58) Field of Classification Search
CPC ............. H01L 27/3276; H01L 27/3248; H01L 27/3258; H01L 51/5203; H01L 51/0097; H01L 21/76898; H01L 21/486
See application file for complete search history.

(56) References Cited

U.S. PATENT DOCUMENTS 9,831,391 B2 * 11/2017 Odaka ..................... H01L 33/44
2003/0164674 A1    9/2003 Imamura
(Continued)

FOREIGN PATENT DOCUMENTS

| JP | 2005-085487 A | 3/2005 |
| JP | 2005-142119 A | 6/2005 |

(Continued)

OTHER PUBLICATIONS

Official Communication issued in International Patent Application No. PCT/JP2017/035168, dated Dec. 26, 2017.

*Primary Examiner* — Jose R Diaz
(74) *Attorney, Agent, or Firm* — Keating & Bennett, LLP

(57) ABSTRACT

To reduce a possibility of short circuiting between a wiring line that connects to a terminal unit and a pixel electrode, a display device is provided that includes a first lead wiring line that extends from a display area to a frame area while intersecting with an end portion of a flattening film, a second lead wiring line that is in a layer more on an upper side than the first lead wiring line and extends to a terminal unit while coming into contact with and intersecting with a first bank formed in a periphery of a second electrode, and a first wiring line contact part through which the first lead wiring line and the second lead wiring line connect to each other, the first wiring line contact part being provided between an end portion of the flattening film and the first bank.

16 Claims, 14 Drawing Sheets

(56) References Cited

U.S. PATENT DOCUMENTS

2013/0099218 A1     4/2013   Lee et al.
2014/0332769 A1    11/2014   Lee et al.

FOREIGN PATENT DOCUMENTS

| JP | 2010-282980 A | 12/2010 |
| JP | 2011-146323 A | 7/2011 |
| WO | 03/061346 A1 | 7/2003 |

\* cited by examiner

DISPLAY DEVICE, DISPLAY DEVICE MANUFACTURING METHOD, AND DISPLAY DEVICE MANUFACTURING APPARATUS

TECHNICAL FIELD

The disclosure relates to a display device including a light emitting element.

BACKGROUND ART

PTL 1 discloses an organic EL light emitting device including: a light emission area including a plurality of an organic EL elements; and a non-light emission area that is adjacent to the circumference of the light emission area in which the non-light emission area is provided with a recess and protrusion structure for regulating the spreading of the resin.

CITATION LIST

Patent Literature

PTL 1: JP 2011-146323 A (published Jul. 28, 2011)

SUMMARY

Technical Problem

When the frame area adjacent to the circumference of the area in charge of displaying is provided with a structure such as the recess and protrusion structure and the like for regulating the spreading of the resin, a terminal unit needs to be formed more on the circumference side than the structure. When the structure is formed right above a wiring line to be routed to the terminal unit and then an electrode in the light emission area is formed, a remaining pattern of an electrode may remain in the periphery of the structure involving a large change in height. When the remaining pattern of the electrode is in contact with a wiring line leading to the terminal unit, unexpected short circuiting may occur which results in decreased yield.

Solution to Problem

To solve the problem described above, a display device according to the present application includes: a TFT layer including a plurality of TFTs; a light emitting layer that is on the TFT layer and includes pixel electrodes connected to the respective TFTs and a cover film that is formed on the pixel electrodes; and a sealing layer formed on the light emitting element layer. The display device further includes, in a frame area adjacent to a circumference of a light emission area, a bank that surrounds the light emission area and regulates expansion of the sealing layer, a terminal unit more on a circumference side than the bank, and a wiring line connected to the terminal unit. The bank is formed in the same layer as the cover film and is in contact with the wiring line. The terminal unit and at least a part of the wiring line are in the same layer as a source wiring line of the TFT layer.

To solve the problem described above, a manufacturing method for a display device according to the present application includes forming a TFT layer including a plurality of TFTs, a light emitting element layer that is formed on the TFT layer and includes pixel electrodes connected to the respective TFTs and a cover film that is formed on the pixel electrodes, and a sealing layer formed on the light emitting element layer in this order with the TFT being the bottom layer. The method includes a terminal unit forming step of forming, together with a source wiring line of the TFTs, a terminal unit in a frame area adjacent to a circumference of the light emission area and at least a part of the wiring line that connects to the terminal unit, and a bank forming step of forming, together with the cover film, a bank in the frame area, the bank coming into contact with the wiring line and regulating expansion of the sealing layer.

To solve the problem described above, a manufacturing apparatus for a display device according to the present application includes a film forming device configured to form a TFT layer including a plurality of TFTs, a light emitting element layer that is formed on the TFT layer and includes pixel electrodes connected to the respective TFTs and a cover film that is formed on the pixel electrodes, and a sealing layer formed on the light emitting element layer. The film forming device forms, in a frame area adjacent to a circumference of a light emission area, a bank that surrounds the light emission area and regulates spreading of the sealing layer, a terminal unit that is more on a circumference side than the bank, and a wiring line that connects to the terminal unit.

The bank is in the same layer as the cover film and is in contact with the wiring line. The terminal unit and at least a part of the wiring line are in the same layer as a source wiring line for the TFT layer.

Advantageous Effects of Disclosure

The configuration can provide a display device with which a possibility of short circuiting between a wiring line connected to a terminal unit and a pixel electrode can be reduced.

DESCRIPTION OF EMBODIMENTS

First Embodiment

In the following description, "in the same layer" means that elements are formed by the same material and by the same process. A layer formed "beneath" a comparison target layer is formed in a process earlier than that for forming the comparison target layer, and a layer formed "on" a comparison target layer is formed in a process later than that for forming the comparison target layer. In this specification, a direction from a lower layer to an upper layer of the display device corresponds to an upper side.

Figure 1:
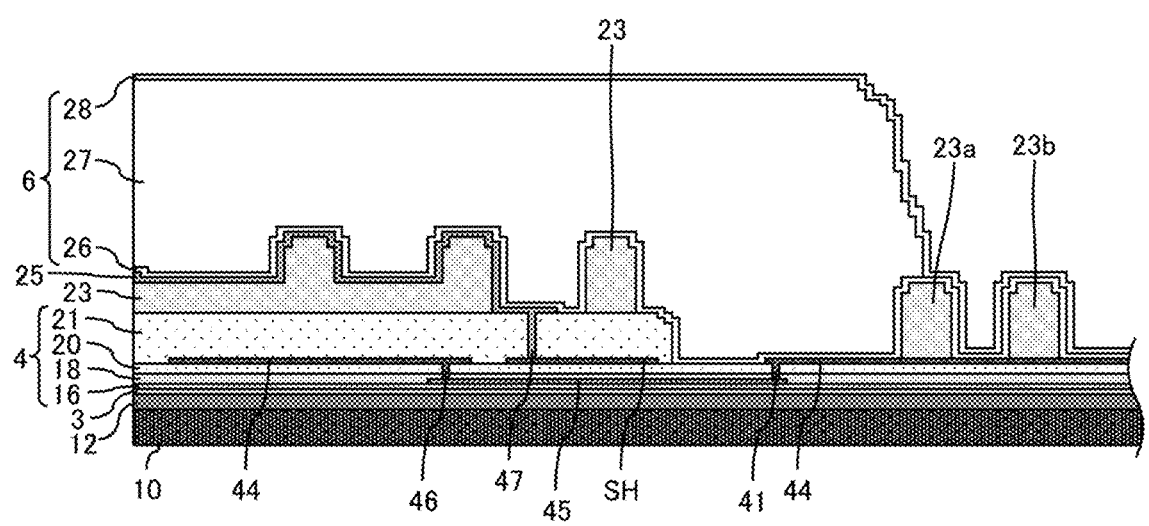
FIG. 1 is a cross-sectional view illustrating a portion around a first bank and a second bank in a frame area of a display device according to a first embodiment.
Figure 2:
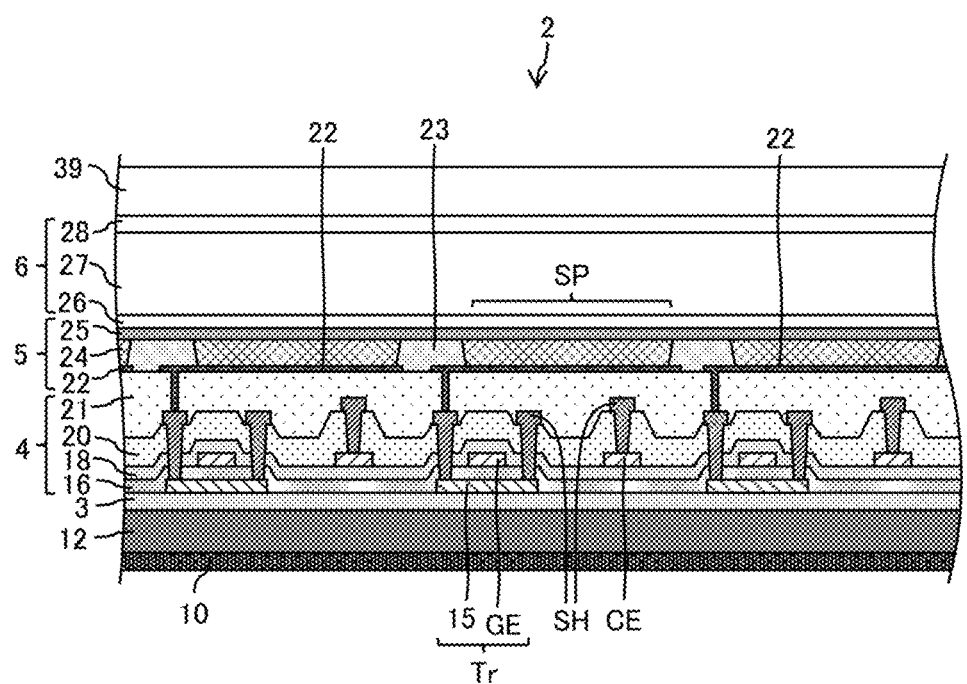
FIG. 2 is a cross-sectional view of a light emission area of the display device according to the first embodiment.
Figure 3:
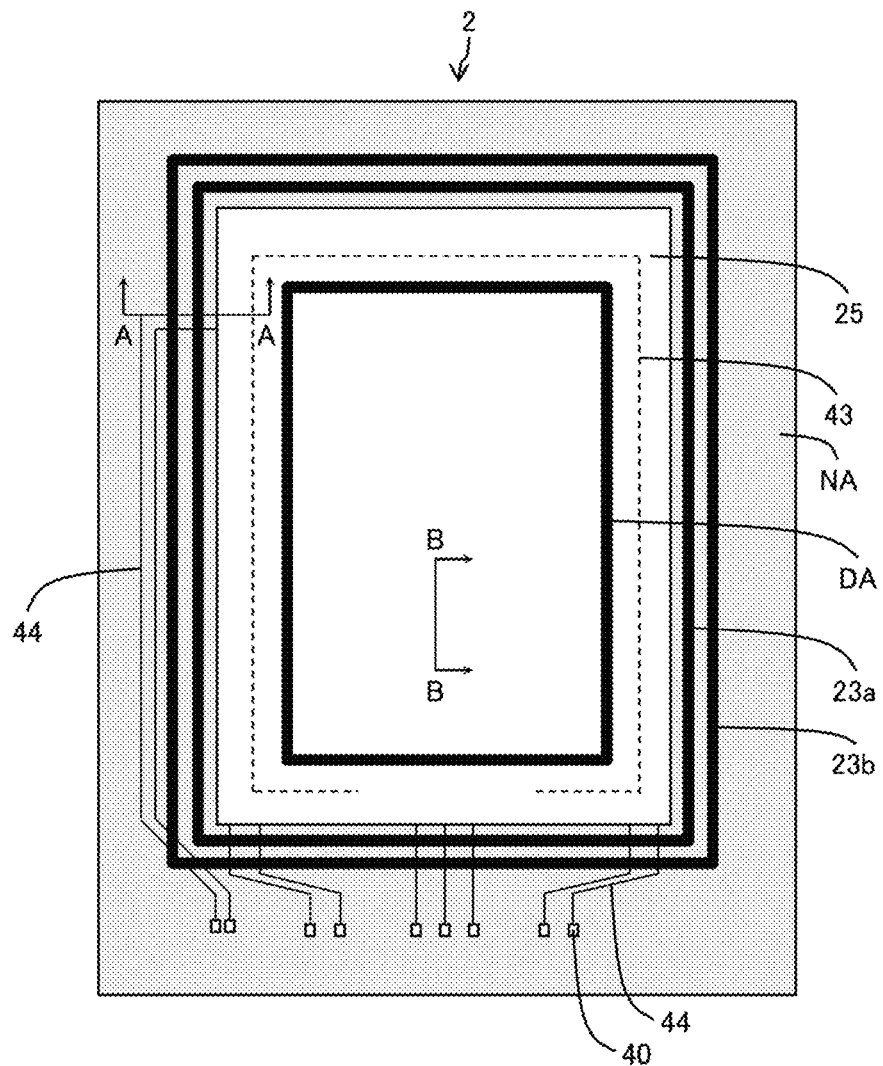
FIG. 3 is a plan view of the display device according to the first embodiment.

FIG. 3 is a plan view of a display device 2 according to the present embodiment. FIG. 1 is a cross-sectional view taken along a line indicated by arrows AA in FIG. 3, and FIG. 2 is a cross-sectional view taken along a line indicated by arrows BB in FIG. 3.

The display device 2 according to the present embodiment includes a display area DA and a frame area NA that is provided adjacent to and in the periphery of the display area DA, as illustrated in FIG. 3. The display device 2 according to the present embodiment is described in detail with reference to FIG. 2.

As illustrated in FIG. 2, the display device 2 according to the present embodiment includes a support substrate 10, a resin layer 12, a barrier layer 3, a TFT layer 4, a light emitting element layer 5, a sealing layer 6, and an upper face film 39 in this order with the support substrate 10 being the bottom layer.

The support substrate 10 may be a glass substrate for example. An example of a material of the resin layer 12 includes polyimide.

The barrier layer 3 is a layer for preventing foreign matters such as water and oxygen from reaching the TFT layer 4 and the light emitting element layer 5 during usage of the display device. The barrier layer 3 may be made of a silicon oxide film, silicon nitride film, or silicon oxynitride film formed by CVD, or a layered film thereof, for example.

The TFT layer 4 includes a semiconductor layer 15, a first inorganic layer 16 (gate insulating film), a gate electrode GE (first wiring line), a second inorganic layer 18, capacity wiring line CE, a third inorganic layer 20, source wiring line SH (second wiring line), and a flattening film 21 (inter layer insulating film) in this order with the semiconductor layer 15 being the bottom layer. A thin film transistor (TFT) Tr is configured to include the semiconductor film 15, the first inorganic layer 16, and the gate electrode GE.

The semiconductor layer 15 is formed of, for example, low temperature polysilicon (LTPS) or an oxide semiconductor. Note that, in FIG. 2, the TFT is illustrated that has a top gate structure in which the semiconductor layer 15 is the channel, but the TFT may have a bottom gate structure (when the TFT channel is the oxide semiconductor, for example).

The gate electrode GE, the capacity electrode CE, or the source wiring line SH may be composed of at least one metal selected from aluminum (Al), tungsten (W), molybdenum (Mo), tantalum (Ta), chromium (Cr), titanium (Ti), and copper (Cu), for example. The gate electrode GE, the capacity electrode CE, or the source wiring line SH is composed of a single layer film or a layered film composed of the above described metal, for example. In particular, in the present embodiment, the gate electrode GE is composed of Mo and the source wiring line SH is composed of Al.

The first inorganic layer 16, the second inorganic layer 18, and the third inorganic layer 20 can be constituted by a silicon oxide (SiOx) film or a silicon nitride (SiNx) film, or a layered film of these, formed using CVD. The flattening film 21 may be formed of a coatable photosensitive organic material, such as a polyimide material or an acrylic material.

The light emitting element layer 5 (for example, an organic light emitting diode layer) includes a pixel electrode 22 (first electrode, an anode for example), a cover film 23 that covers an edge of the pixel electrode 22, a light emitting layer 24, and an upper electrode (second electrode, a cathode for example) 25. The light emitting element layer 5 is provided with, for each subpixel SP, a light emitting element (organic light emitting diode (OLED) for example) and a subpixel circuit that drives the element including an island-shaped pixel electrode 22, an island-shaped light emitting layer 24, and an upper electrode 25.

The cover film 23 is an organic insulating film and is formed by performing patterning through photolithography, after application of a photosensitive organic material such as polyimide and acryl. The cover film 23 has openings each provided for a plurality of subpixels SP.

For example, the light emitting layer 24 is formed by layering a hole transport layer, a light emitting layer, and an electron transport layer, in this order, with the hole transport layer being the bottom layer. The light emitting layer is formed for each subpixel SP to have an island shape by vapor deposition or an ink-jet method. The hole transport layer and the electron transport layer may be formed to have an island shape for each subpixel SP, or may be formed to be in a solid form to serve as a common layer for a plurality of subpixels SP.

The pixel electrode 22 is photoreflective and is formed to have an island shape for a plurality of subpixels SP, by the layering of Indium Tin Oxide (ITO) and an alloy containing Ag. The upper electrode 25 is formed in a solid form to serve as a common layer for a plurality of subpixels SP, and can be constituted by a light-transmissive conductive material such as indium tin oxide (ITO) and indium zinc oxide (IZO).

In the case that the light emitting element layer 5 is an OLED layer, holes and electrons are recombined in the light emitting layer 24 by the driving current between the pixel electrode 22 and the upper electrode 25 and the excitons generated thereby fall to the ground state such that light is emitted. Since the upper electrode 25 is light-transmissive and the pixel electrode 22 is photoreflective, the light emitted from the light emitting layer 24 travels upwards and results in top emission.

The sealing layer 6 includes an inorganic sealing film 26 formed on the upper electrode 25, an organic sealing film 27 formed on the inorganic sealing film 26, and an inorganic sealing film 28 formed on the organic sealing film 27 and prevents foreign matters such as water and oxygen from reaching the light emitting element layer 5. The inorganic sealing films 26 and 28 may be made of a silicon oxide film, silicon nitride film, or silicon oxynitride film formed by CVD, or a layered film thereof, for example. The organic sealing film 27 may be made of a coatable photosensitive organic material such as polyimide or an acrylic.

The upper face film 39 may be a functional film including, for example, an optical compensation function, a touch sensor function, a protection function, or the like.

FIG. 1 is a cross-sectional view taken by a line indicated by arrows AA in FIG. 3, and illustrates a periphery of a bank in the frame area NA provided adjacent to and in the periphery of the display area DA of the display device 2 according to the present embodiment.

As illustrated in FIG. 1 and FIG. 3, the display device 2 includes a first bank 23a, a second bank 23b, and a terminal unit 40 in the frame area NA.

The first bank 23a is formed to have a frame shape at a position to surround the periphery of the upper electrode 25. The second bank 23b is formed to have a frame shape in the periphery of the first bank 23a. The first bank 23a and the second bank 23b are in the same layer as the cover film 23. The first bank 23a and the second bank 23b regulate spreading of the organic sealing film 27 of the sealing layer 6 as the upper layer, when the organic sealing film 27 is applied.

The terminal units 40 are formed in the periphery of the second bank 23b. The terminal units 40 are connected to lead wiring lines 44 (second lead wiring lines) that is in the same layer as the source wiring line SH and are extended to the frame area NA. The terminal units 40 allows a signal from the external to be input to the display area DA. The lead wiring line 44 extends on the third inorganic layer 20 toward the display area DA, to a position slightly more on the outer side than the flattening film 21. Thus, the lead wiring line 44 intersects with the first bank 23a and the second bank 23b while being in contact with the first bank 23a and the second bank 23b.

In the frame area NA, the lead wiring line 45 (first lead wiring line) that is in the same layer as the gate electrode DE is formed, and is connected to the lead wiring line 44 in the first wiring line contact part 41. The first wiring line contact part 41 is formed more on the circumference side than the flattening film 21 and more on the inner side than the first bank 23a. A lead wiring line connected to the terminal 40 takes a detour by transitioning from the lead wiring line 44 to the lead wiring line 45 in the first wiring line contact part 41. Thus, the lead wiring lines 44 and 45 are separated from and thus is not in contact with the flattening film 21.

The flattening film 21 has a TFT conductive layer that is electrically connected to the upper electrode 25 at an outer edge of the display area DA. The conductive layer may be in the same layer as the source wiring line SH as illustrated in FIG. 1. The upper electrode 25 and the conductive layer are electrically connected to each other through a slit 47 formed in the flattening film 21 and the cover film 23.

Furthermore, the lead wiring line 45 extends from the first wiring line contact part 41 to the display area while intersecting with an end portion of the flattening film 21 and the conductive layer. The lead wiring line 45 is connected to the lead wiring line 44 via the second wiring line contact part 46. The second wiring line contact part 46 is formed between the display area DA and the conductive layer. The lead wiring line 44 in the display area DA is connected to each TFT.

The lead wiring line 44 that extends to the terminal unit 40 while intersecting with the second bank 23b is formed at a position to be also overlapped by at least one of the first bank 23a and another portion of the second bank 23b before being connected to the terminal unit 40. For example, as illustrated in FIG. 3, the lead wiring line 44 formed more on the circumference side than the second bank 23b intersects with and is in contact with at least one of the first bank 23a and the second bank 23b at a portion near a corner of the display area DA, before being connected to the terminal unit 40.

Figure 4:
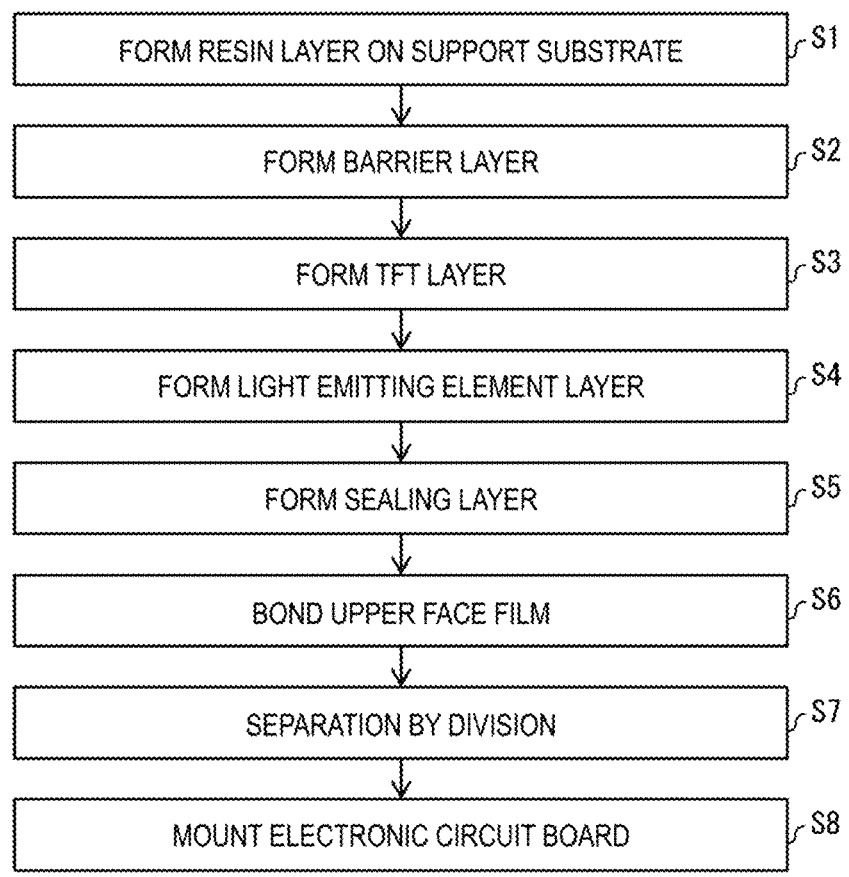
FIG. 4 is a flowchart illustrating a manufacturing method of the display device according to the first embodiment.
Figure 5:
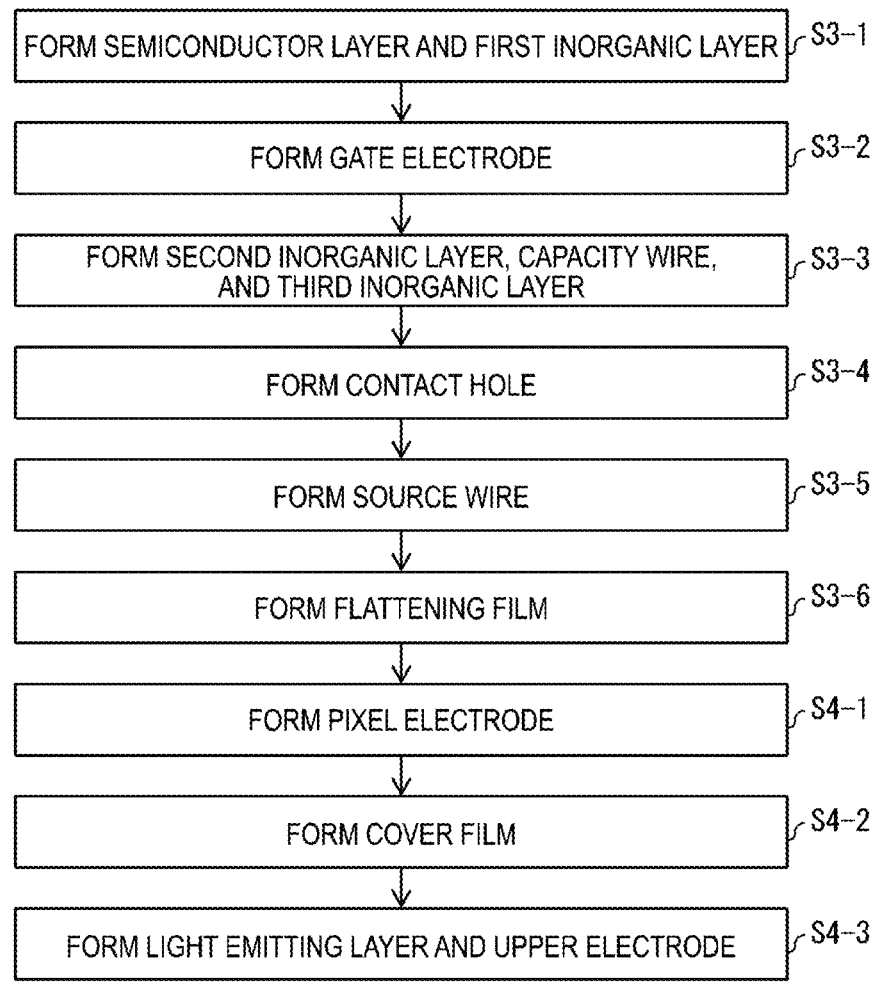
FIG. 5 is a flowchart illustrating formation of a TFT layer and a formation of a light emitting element layer in the manufacturing method of the display device according to the first embodiment.

A method of manufacturing the display device 2 according to the present embodiment is described in detail with reference to flowcharts in FIG. 4 and FIG. 5.

First of all, the resin layer 12 is formed on a light transmitting support substrate (a glass mother substrate for example) (step S1). Next, the barrier layer 3 is formed on the resin layer 12 (Step S2).

Figure 6:
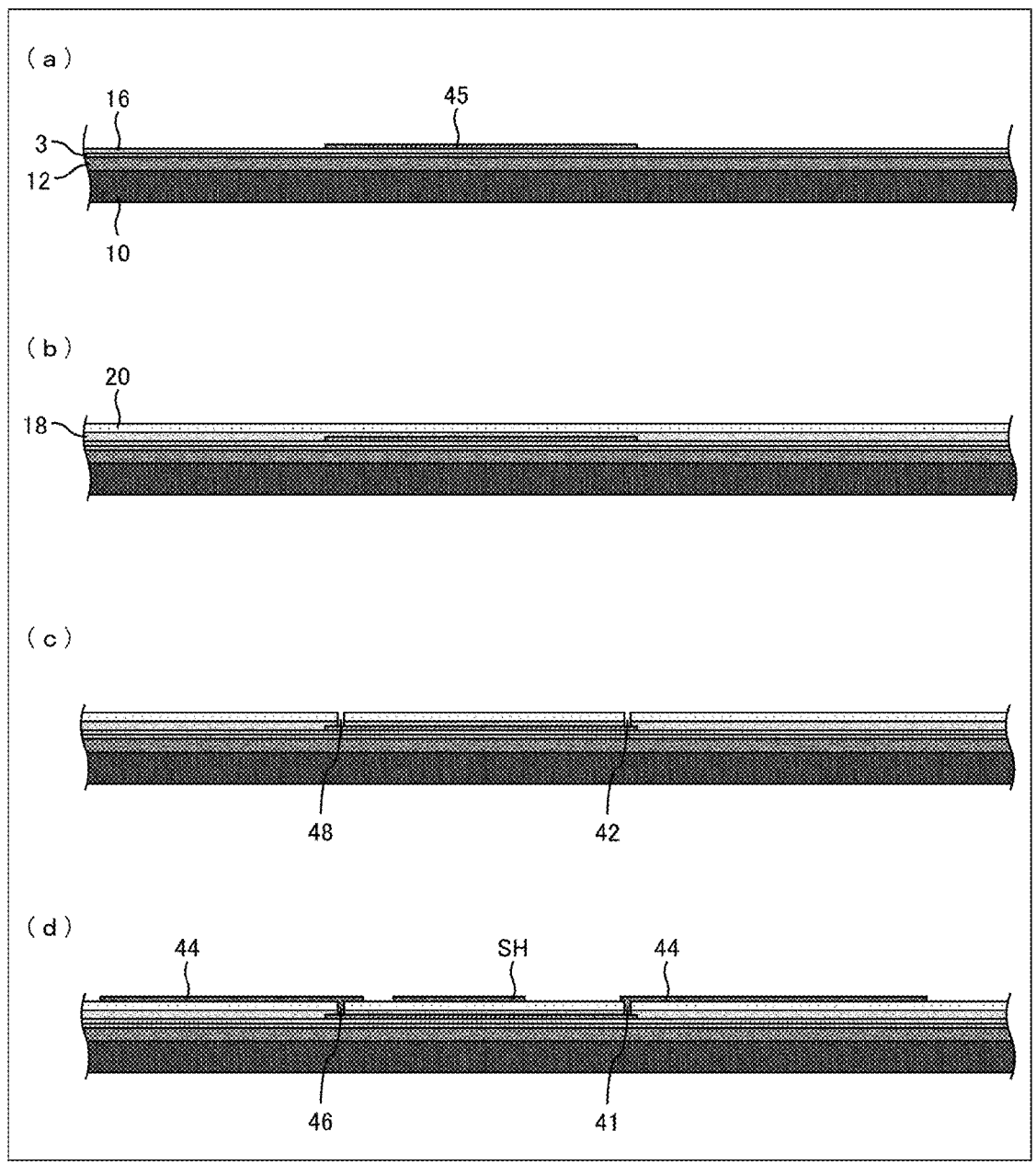
FIG. 6 is a cross-sectional view of process for describing the manufacturing method of the display device according to the first embodiment.
Figure 7:
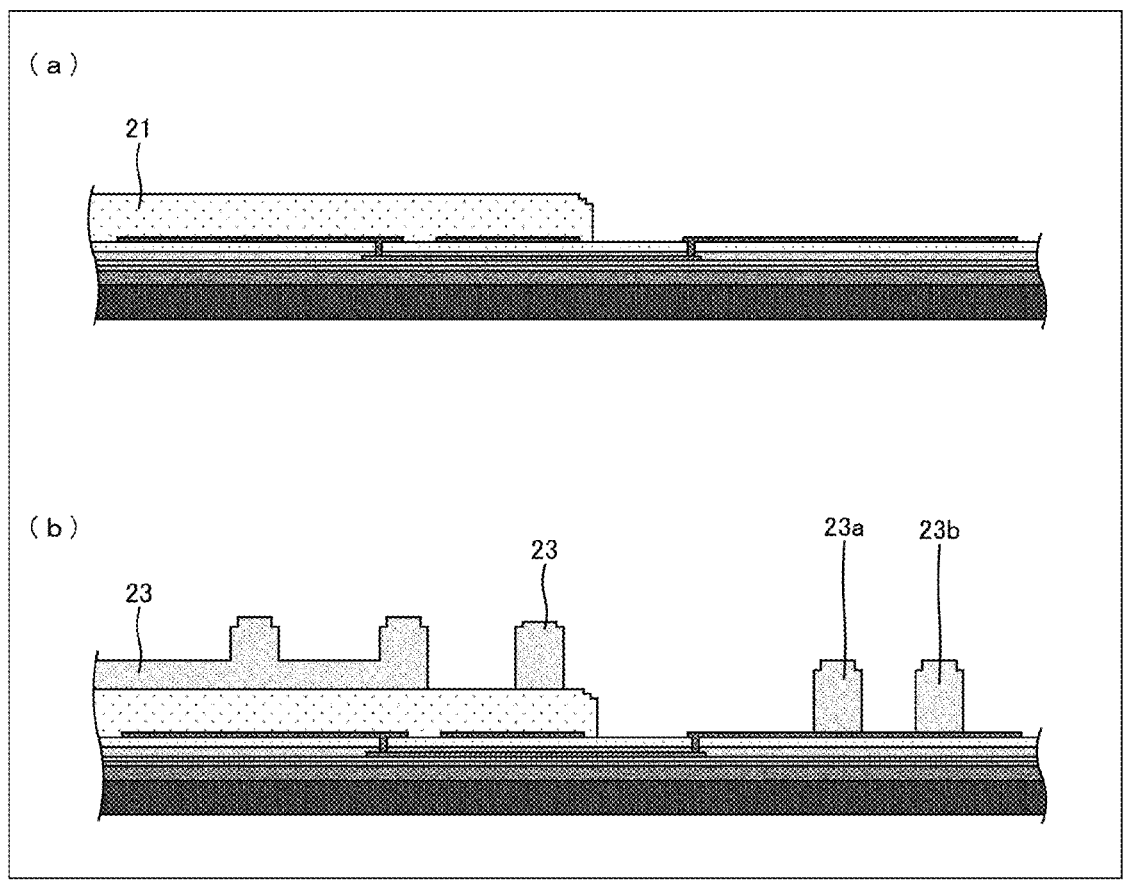
FIG. 7 is other cross-sectional view of process for describing the manufacturing method of the display device according to the first embodiment.

Next, the TFT layer 4 is formed on the barrier layer 3 (step S3). Next, a light emitting element layer (for example, an OLED element layer) 5 of a top emission type is formed (step S4). Steps S3 and S4 are described more in detail with reference to cross-sectional views of processes in FIG. 6 and FIG. 7. FIG. 6 and FIG. 7 are each a diagram illustrating a configuration at a position corresponding to that in FIG. 1 in step S3 and step S4.

In step S3, first of all, the semiconductor layer 15 and the first inorganic layer 16 are formed on the barrier layer 3 in this order with the semiconductor layer 15 being the lower layer (step S3-1). Next, the gate electrode GE is formed (step S3-2). In this process, the lead wiring line 45 to be connected to the terminal unit is formed to be in the same layer as the gate electrode GE as illustrated in (a) of FIG. 6.

Next, the second inorganic layer 18, the capacity wiring line CE, and the third inorganic layer 20 are formed in this order with the second inorganic layer 18 being the bottom layer (step S3-3). As a result, as illustrated in (b) of FIG. 6, the second inorganic layer 18 and the third inorganic layer 20 are formed on the gate electrode GE in the frame area NA.

Next, as illustrated in (c) of FIG. 6, on the gate electrode GE in the frame area NA, openings to be first and second contact holes 42 and 48 are formed through the second inorganic layer 18 and the third inorganic layer 20 (step S3-4). The first and the second contact holes 42 and 48 may be formed together with contact holes enabling contact between the semiconductor layer 15 and the source wiring line SH and between the capacity wiring line CE and the source wiring line SH.

Next, the source wiring line SH is formed (step S3-5). In this process, the lead wiring lines 44 are formed to be in the same layer as the source wiring line SH as illustrated in (d) of FIG. 6. The lead wiring lines 44 are also formed in the first and the second contact holes 42 and 48. As a result, as illustrated in (d) of FIG. 6, the lead wiring line 44 and the lead wiring line 45 are connected to each other at the first wiring line contact part 41 and the second wiring line contact part 46 in the frame area NA. In step S3-5, the TFT conductive layer may be formed to be in the same layer as the source wiring line SH.

Next, the flattening film 21 is formed (step S3-6), and thus the TFT layer 4 is completely formed. As illustrated in (a) of FIG. 7, the flattening film 21 is formed to have an outermost end positioned between the conductive layer and the lead wiring line 44 on the frame area NA side, and to be separated from the lead wiring line 44 in the frame area NA.

Then, the process transitions to step S4 where the pixel electrode 22 is formed (step S4-1). In this process, the pixel electrode 22 is formed on the lead wiring line 44 in the frame area NA but that pixel electrode 22 is removed from the portion on the lead wiring line 44 through patterning using sputtering.

Next, the cover film 23 is formed (step S4-2). In this process, as illustrated in (b) of FIG. 7, the first bank 23a and the second bank 23b are also formed when the cover film 23 is formed, at positions including portions immediately above the lead wiring line 44 connected to the terminal unit 40. Next, the light emitting layer 24 and the upper electrode 25 are formed in this order with the light emitting layer 24 being the lower layer (step S4-3), and thus the light emitting element layer 5 is completed. When the upper electrode 25 is formed, the upper electrode 25 and the TFT conductive layer may be connected to each other with the slit 47 formed through the flattening film 21 and the cover film 23 at an end portion of the flattening film 21.

Next, the sealing layer 6 is formed (step SS). In this process, when the organic sealing film 27 of the sealing layer 6 is formed, the first bank 23a and the second bank 23b regulate the spreading of the organic sealing film 27. In step SS, the source wiring lines SH exposed in the frame area NA form the terminal units 40, and thus the terminal unit forming process is completed.

Next, an upper face film is attached to the sealing layer 6 (step S6). Then, a layered body including the support substrate 10, the resin layer 12, the barrier layer 3, the TFT layer 4, the light emitting element layer 5, the sealing layer 6, and the upper face film 39 is divided, and a plurality of individual pieces are cut out (step S7). Then an electronic circuit board (an IC chip for example) is mounted on the terminal units 40, whereby the display device 2 is obtained (step S8).

In the present embodiment, a method of manufacturing the display device 2 including the rigid support substrate 10 is described. It is noted that the display device 2 with flexibility can be manufactured by performing an additional process. For example, after step S6, the lower face of the resin layer 12 is irradiated with a laser beam through the support substrate 10, so that the bonding force between the support substrate 10 and the resin layer 12 is weakened. Then, the support substrate 10 is peeled from the resin layer 12. Subsequently, a lower face film is attached to the lower face of the resin layer 12. Then, the process transitions to step S7, whereby the display device 2 with flexibility can be obtained.

Figure 8:
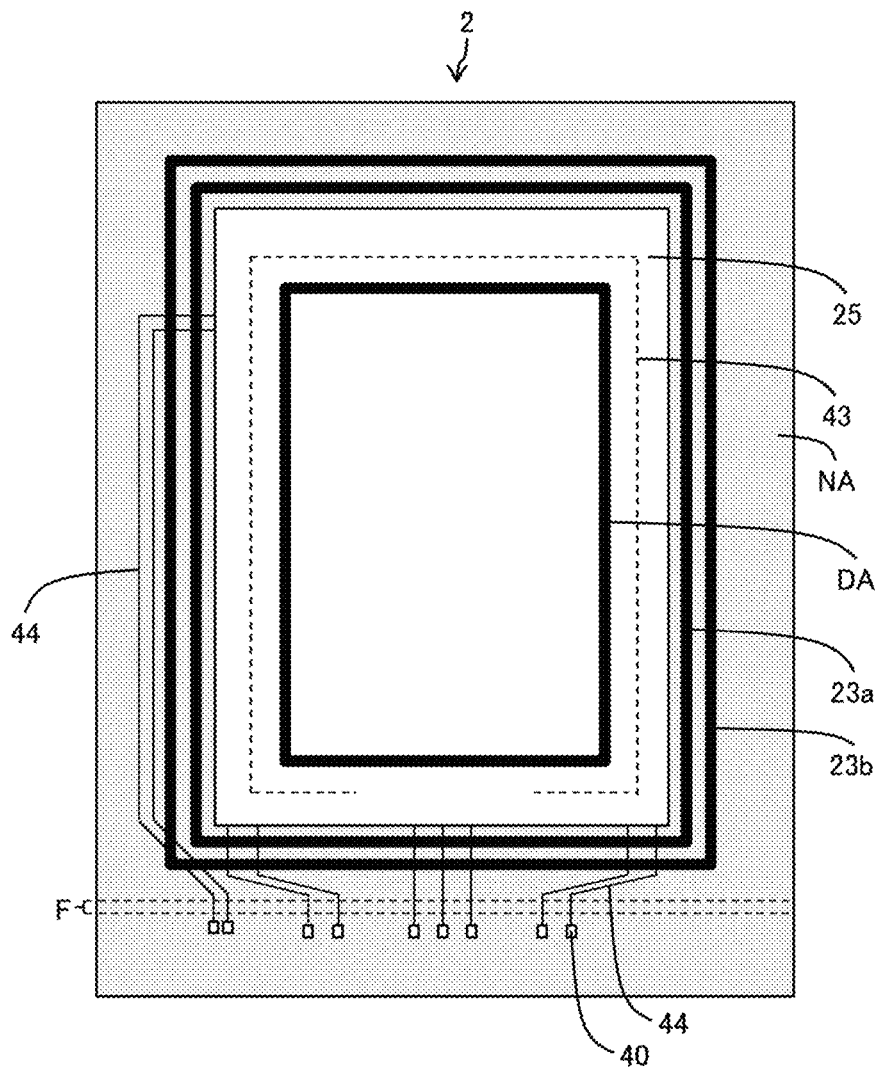
FIG. 8 is a plan view of a display device according to a modification.

The display device 2 with flexibility may have a folding portion F in the frame area NA as illustrated in FIG. 8. The display device 2 illustrated in FIG. 8 is folded at the folding part F toward the side opposite to the upper layer, whereby a portion at or more on the circumference side than the terminal unit 40 can be folded toward the inner side of the display device 2. Thus, the frame area NA in the upper face of the display device 2 can be downsized, whereby a narrower frame can be achieved. The wiring line intersecting with the folding part F may be in the same layer as the lead wiring line 44.

The display device 2 according to the present embodiment has the pixel electrode 22 formed before the first bank 23a and the second bank 23b are formed. Thus, the pixel electrode 22 is formed in a state where no structures providing large recesses or protrusions, such as the first bank 23a and the second bank 23b, are on the lead wiring line 44 in the frame area NA. Thus, the first bank 23a and the second bank 23b are less likely to have a remaining pattern of the pixel electrode 22. Thus, a possibility of short circuiting between the remaining pattern of the pixel electrode 22 and the lead wiring line 44 is reduced, whereby the yield of the display device 2 is improved.

Generally, the flattening film 21 has a thickness from 1.5 to 2.5 μm, and thus the remaining pattern of the pixel electrode 22 may remain at an end portion of the flattening film 21. However, in the present embodiment, the lead wiring lines 44 and 45 do not come into contact with the flattening film 21 formed before the pixel electrode 22. Thus, even if the remaining pattern of the pixel electrode 22 remains on the flattening film 21, the remaining pattern does not come into contact with the lead wiring lines 44 and 45, whereby a risk of short circuiting between the pixel electrode 22 and the lead wiring lines 44 and 45 can further be reduced.

At a position where the flattening film 21 is formed, the wiring line connected to the terminal unit 40 takes a detour by transitioning from the lead wiring line 44 to the lead wiring line 45 via the first wiring line contact part 41. Still, the lead wiring line 45 in the same layer as the gate electrode GE is used for only a part of the wiring line connected to the terminal unit 40. Thus, a part of the wiring line that is in the same layer as the gate electrode GE with a higher resistance than the source wiring line SH can be made smaller. Thus, the resistance of the terminal unit 40 and the wiring line connected to the terminal unit 40 can be set to be lower.

At a portion around a corner of the display area DA, the wiring line needs not take a detour to prevent the lead wiring line 44 from coming into contact with the first bank 23a or the second bank 23b. Thus, a higher degree of design freedom of the lead wiring line 44 in the frame area NA can be achieved, whereby the lead wiring lines 44 can be prevented from being densely arranged in a portion around a corner of the display area DA so that a possibility of short circuiting therebetween can be reduced.

A modification of the display device 2 according to the present embodiment is described with reference to FIG. 9. (a) of FIG. 9 and (b) of FIG. 9 illustrate configurations of the display device 2 according to the present modification at positions respectively corresponding to FIG. 1 and FIG. 3.

Figure 9:
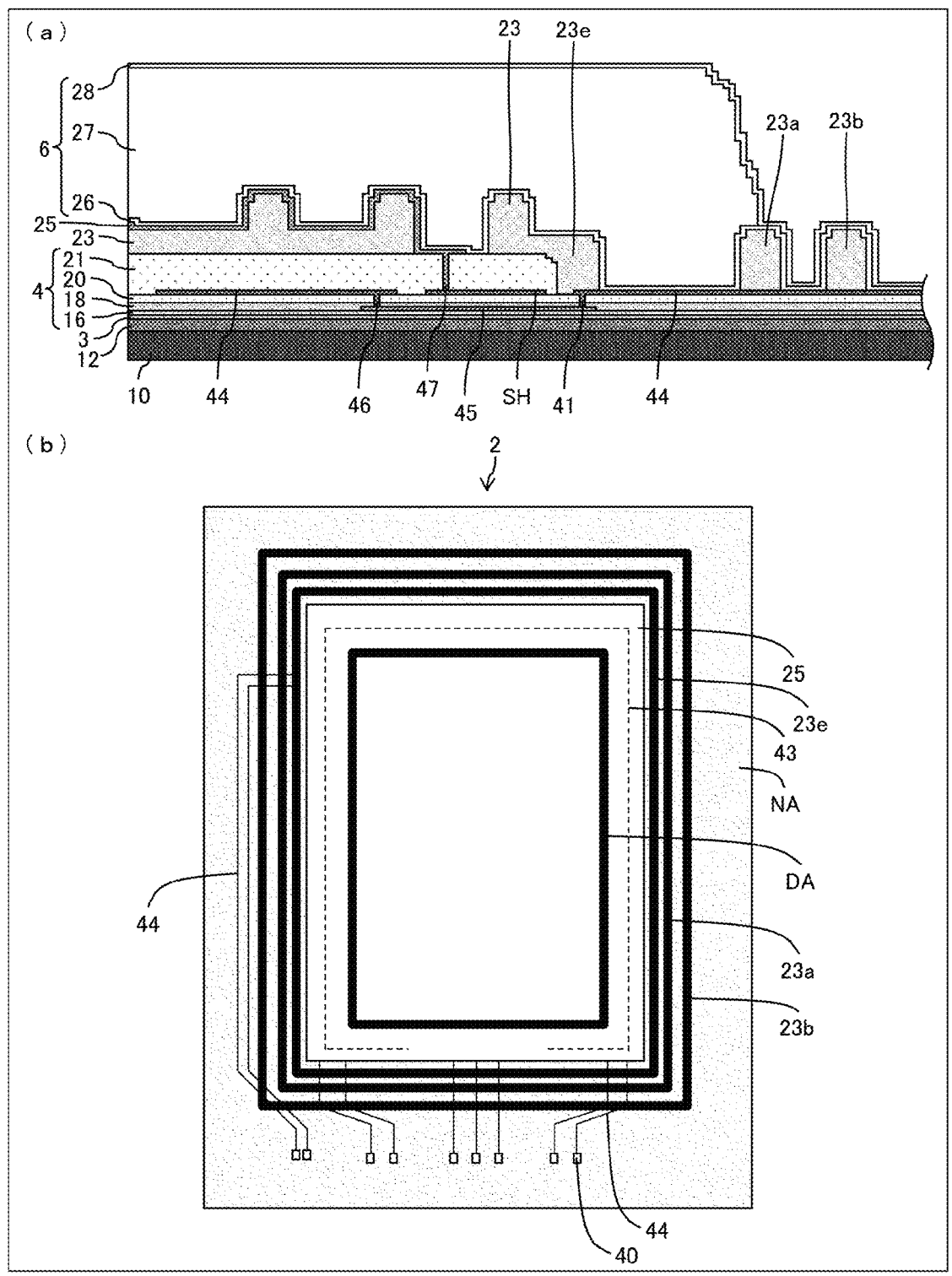
FIG. 9 is a plan and cross-sectional view illustrating a portion around a first bank and a second bank in a frame area of a display device according to a modification.

The display device 2 according to the modification further includes a cover film 23e that covers an end portion of the flattening film 21 as illustrated in (a) of FIG. 9. The cover film 23e is formed at a position to surround the upper electrode 25 as illustrated in (b) of FIG. 9. The cover film 23e may be formed together with the cover film 23.

Second Embodiment

Figure 10:
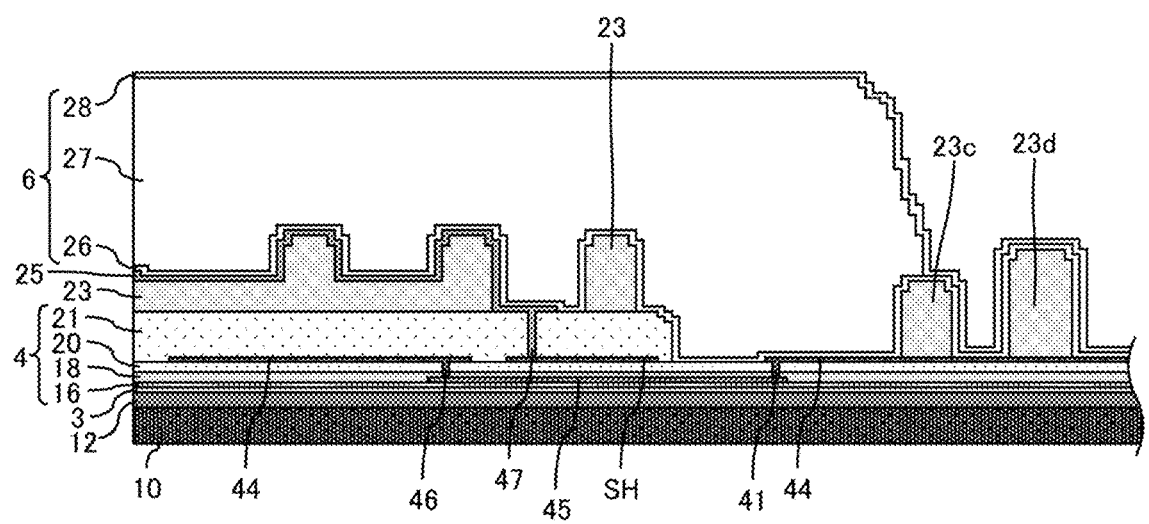
FIG. 10 is a cross-sectional view illustrating a portion around a first bank and a second bank in a frame area of a display device according to a second embodiment.

FIG. 10 is a cross-sectional views illustrating a configuration example of a display device 2 according to the present embodiment. The display device 2 according to the present embodiment is only different from the display device 2 according to the previous embodiment, in that a first bank 23c and a second bank 23d are formed instead of the first bank 23a and the second bank 23b. FIG. 10 is a diagram illustrating a configuration of the display device 2 according to the present embodiment at a position corresponding to that of FIG. 1.

Unlike the first bank 23a and the second bank 23b of the previous embodiment, the first bank 23c and the second bank 23d have different shapes. Specifically, as illustrated in FIG. 10, the second bank 23d has a larger bank width than the first bank 23c. Furthermore, the second bank 23d has a higher height than the first bank 23c. The bank width is the largest width of the lower face of the bank formed, and the height is the maximum distance between the lower face and the upper face of the bank.

A method for manufacturing the display device 2 according to the present embodiment may be the same as the method of manufacturing the display device 2 according to the previous embodiment, except for step S4-2. In step S4-2 of the present embodiment, the first bank 23c and the second bank 23d are formed.

In step S4-2, first of all, an organic material that is a material of the cover film 23 is applied to have a substantially equal height. Next, the organic material is patterned to make the first bank 23c have a larger bank width than the second bank 23d. Next, the organic material is baked, whereby the cover film 23, the first bank 23c, and the second bank 23d are formed.

Figure 11:
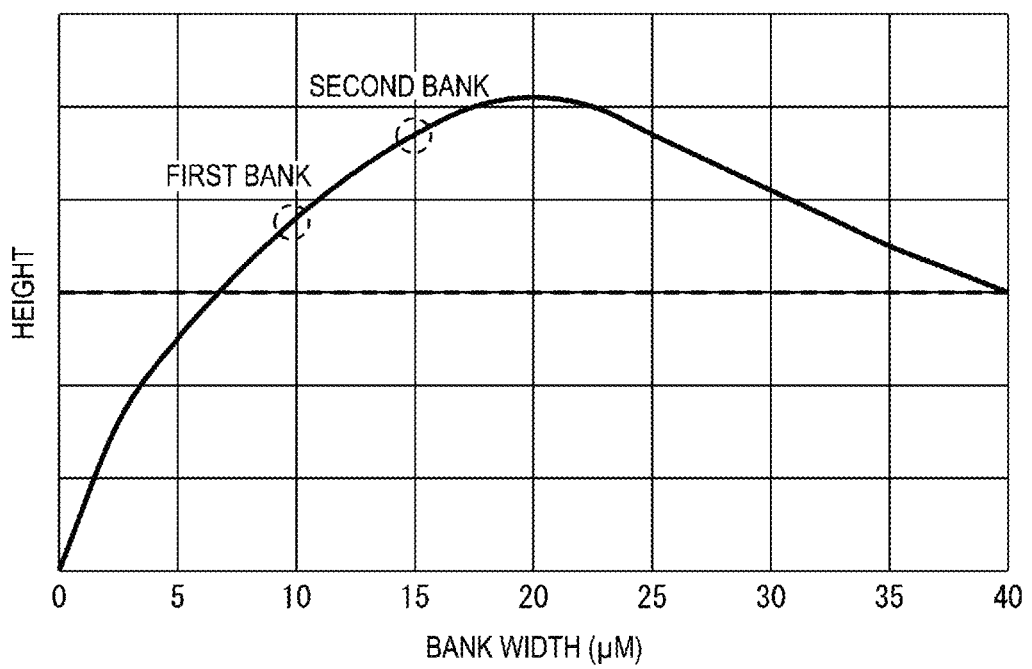
FIG. 11 is a graph illustrating relationship between a width of a bank and how a height of the bank changes before and after baking in the display device according to the second embodiment.

The heights of the first bank 23c and the second bank 23d change due to deformation of the organic material caused by heating during the baking process. FIG. 11 is a graph illustrating relationship between the height of the first bank 23c and the second bank 23d changing due to the baking and the bank width of the first bank 23c and the second bank 23d.

In FIG. 11, the height indicated by a dotted line corresponds to the thickness of the organic material applied in step S4-2. Heights indicated by solid lines each correspond to the height of the bank after the baking for each bank width before the baking. As illustrated in FIG. 11, the height after the baking is higher than the height of the organic material immediately after the application, as long as the bank width of the bank is within a range from approximately 7 to 40 μm.

Here, for example, the first bank 23c and the second bank 23d are formed to have the bank widths that are the same as those of the first bank and the second bank illustrated in FIG. 10. In such a case, the first bank 23c and the second bank 23d are different from each other in how the height changes before and after the baking.

For example, in the present embodiment, the bank width of the first bank 23c is set to be 10 μm, and the bank width of the second bank 23d is set to be 15 μm. In such a case, as illustrated in FIG. 10, the baking process increases the heights of both the first bank 23c and the second bank 23d, and results in the height of the second bank 23d being higher than the height of the first bank 23c. Thus, the first bank 23c and the second bank 23d illustrated in FIG. 9 are obtained.

In the display device 2 according to the present embodiment, the second bank 23d has a larger bank width than the first bank 23c. Furthermore, the second bank 23d has a higher height than the first bank 23c. Thus, the second bank 23d more effectively regulates the organic sealing film 27 of the sealing layer 6 spreading beyond the first bank 23c.

In the present embodiment, the heights of the first bank 23c and the second bank 23d are set to be different from each other through the baking process after photolithography. By utilizing the deformation due to the baking process, a height difference from approximately 0.5 to 1.5 μm can be provided between the first bank 23c and the second bank 23d.

Thus, the first bank 23c and the second bank 23d can have different heights without performing photolithography for a plurality of times or performing photolithography using a gray tone mask. Thus, the bank can be more easily formed. Furthermore, in the present embodiment, the bank forming process can be performed by using a smaller amount of organic material, compared with a case where the photolithography is performed for a plurality of times or performed by using a gray tone mask.

The effect of suppressing spreading of the sealing layer 6 can be obtained as long as the first bank 23c and the second bank 23d have a height that is equal to or higher than 2.5 μm. To form such a bank by performing each of applying and patterning for a single time, the material needs to be applied to have a relatively large thickness. However, in a case where the material is applied to be thick to achieve a high bank height, the cover film 23 formed in the same layer may also be thick. This may result in a defect such as a small diameter of the contact hole in the cover film 23, rendering the configuration in the display area DA unachievable.

In the present embodiment, the deformation due to the baking process is utilized so that the height of the bank that is approximately 150% of the application thickness can be achieved. Thus, the first bank 23c and the second bank 23d can have a large thickness with the thickness of the cover film 23 in the display area DA somewhat limited.

Figure 12:
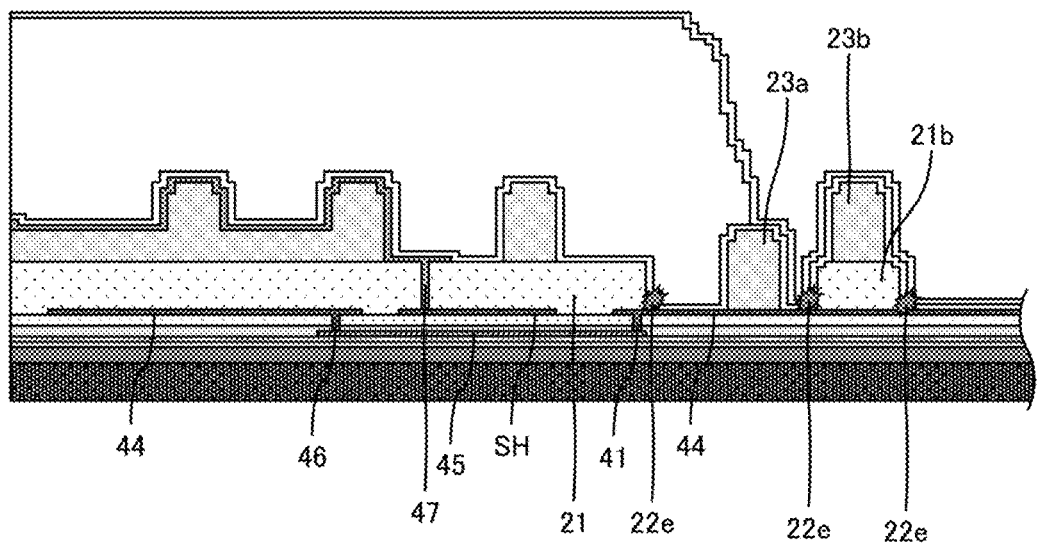
FIG. 12 is a cross-sectional view illustrating a portion around a first bank and a second bank in a frame area of a display device according to a comparative example.

FIG. 12 is a diagram illustrating a display device according to a comparative example. The display device according to the comparative example illustrated in FIG. 12 has a configuration different from that of the display device 2 according to the previous embodiment, in that the first wiring line contact part 41 is formed on the inner side of the cover film 23. The configuration of the display device according to the comparative example is also different from that of the display device 2 according to the previous embodiment in that a second bank 21b, in the same layer as the flattening film 21, is provided beneath the second bank 23. FIG. 12 is a diagram illustrating a configuration of the display device according to the comparative example at a position corresponding to that in FIG. 1.

The display device according to the comparative example has the first wiring line contact part 41 formed on the inner side of the cover film 23 and thus the lead wiring line 44 is in contact with the flattening film 21. The flattening film 21 is formed before the pixel electrode 22 is formed. Thus, a remaining pattern 22e of the pixel electrode 22 might remain on the flattening film 21.

In the comparative example, the second bank 21b that is in the same layer as the flattening film 21 is formed beneath the second bank 23b. Thus, the second bank 21b is formed before the pixel electrode 22 is formed, and thus the remaining pattern 22e of the pixel electrode 22 may remain on the second bank 21b.

Thus, the remaining pattern 22e may come into contact with the lead wiring line 44. The contact between the remaining pattern 22e and the lead wiring line 44 results in unexpected short circuiting between the pixel electrode 22 and the terminal unit 40, which results in a reduced yield.

Figure 13:
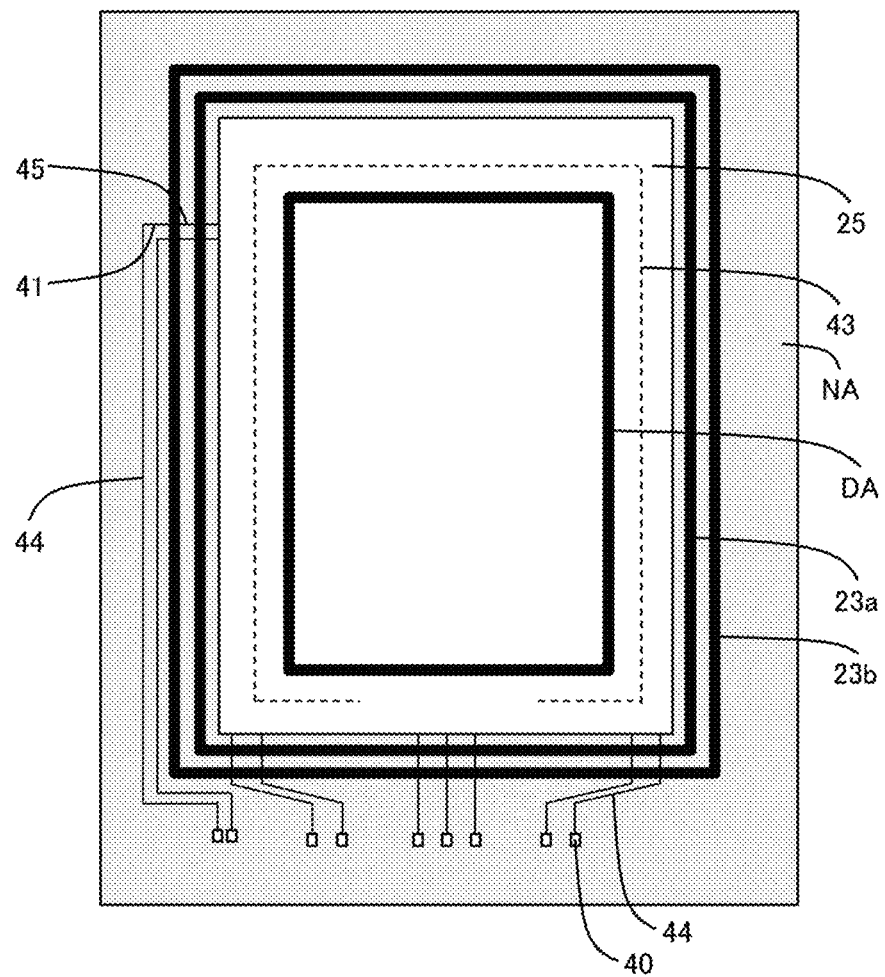
FIG. 13 is a plan view of a display device according to another comparative example.

FIG. 13 illustrates a display device according to another comparative example. The display device illustrated in FIG. 13 is different from the display device illustrated in FIG. 12 in that the first wiring line contact part 41 is formed more on the circumference side than the second banks 21b and 23b.

This configuration can achieve a lower possibility of the lead wiring line 44 and the remaining pattern 22e coming into contact with each other, but results in a long distance between the first wiring line contact part 41 and the second wiring line contact part 46 which directly leads to a long length of the lead wiring line 45. As a result, the lead wiring line 45 has a higher resistance than the lead wiring line 44, resulting in a higher resistance of the wiring line connected to the terminal unit 40.

Furthermore, the lead wiring line 44 routed to be more on the outer circumference side than the bank needs to be prevented from coming into contact with the bank, and thus needs to take a detour to avoid the bank, at a corner portion of the display area DA. All things considered, the degree of freedom of the wiring design is compromised, and the lead wiring lines 44 are densely arranged around a corner of the display area DA, resulting in a higher possibility of short circuiting therebetween.

Figure 14:
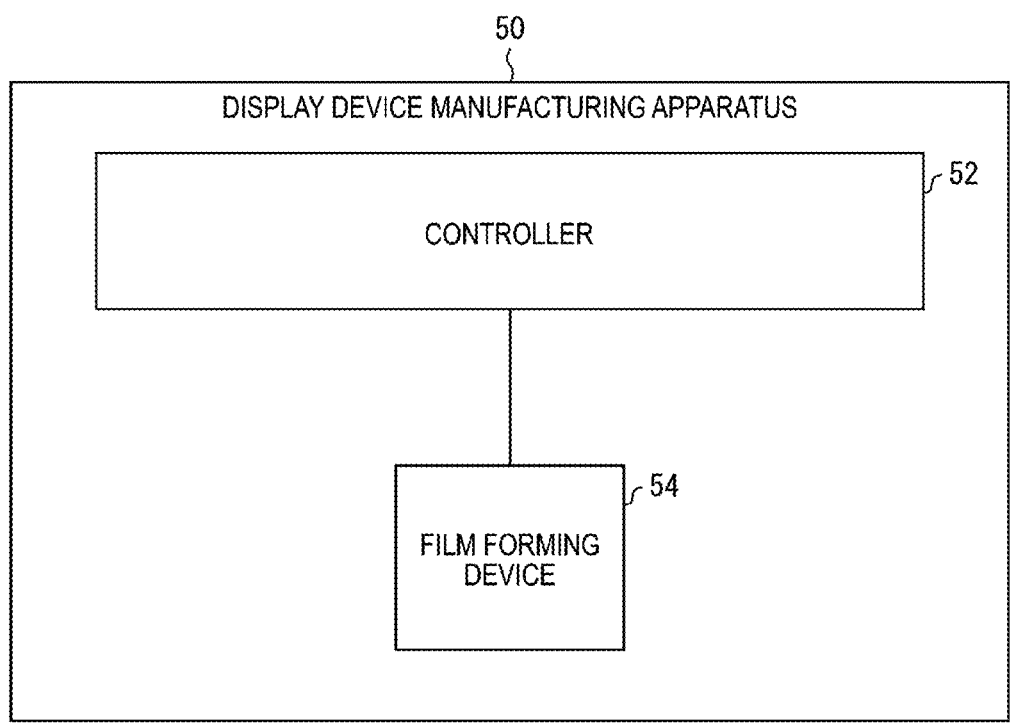
FIG. 14 is a block diagram illustrating a configuration of a manufacturing apparatus for the display devices according to the embodiments.

FIG. 14 is a block diagram illustrating a display device manufacturing apparatus 50 used for a process of manufacturing the display device 2 according to the embodiments described above.

The display device manufacturing apparatus 50 includes a controller 52 and a film forming device 54. The controller 52 may control the film forming device 54. The film forming device 54 may form each layer and film of the display device 2.

Supplement

A display device of Aspect 1 includes: a first wiring line; an inorganic layer; a second wiring line; a flattening film; first electrodes; a cover film; a light emitting layer; a second electrode; and a sealing layer, the first wiring line, the inorganic layer, the second wiring line, the flattening film, the first electrodes, the cover film, the light emitting layer, the second electrode, and the sealing layer being arranged in this order with the first wiring line being a bottom layer, wherein the display device includes a display area and a frame area surrounding the display area, the display device includes a terminal unit configured to allow a signal from external to be input to the display area at an end portion of the frame area, the display device includes a plurality of pixels at the display area and each of the first electrodes in each of the plurality of pixels, the cover film includes an opening formed at each of the first electrodes, the display device includes the second electrode common to the plurality of pixels, a first bank in a same layer as the cover film surrounds the second electrode, a lead wiring line extending from the display area to be electrically connected to the terminal unit includes a first lead wiring line in a same layer as the first wiring line and a second lead wiring line in a same layer as the second wiring line, and the first lead wiring line extends from the display area to the frame area while intersecting with an end portion of the flattening film and is connected to the second lead wiring line via a first wiring line contact part in a portion between the end portion of the flattening film and the first bank, and the second lead wiring line is in contact with the first bank and extends to the terminal unit while intersecting with the first bank.

In Aspect 2, a second bank in the same layer as the cover film is further provided, wherein the second bank surrounds the first bank, and the second lead wiring line extends to the terminal unit while intersecting with and being in contact with the second bank.

In Aspect 3, the second bank has a height higher than a height of the first bank.

In Aspect 4, the second bank has a bank width that is wider than a bank width of the first bank.

In Aspect 5, the second lead wiring line that extends to the terminal unit while intersecting with the second bank is overlapped by at least one of the first bank and the second bank before being connected to the terminal unit.

In Aspect 6, the display area has an outer edge provided with a slit formed in the flattening film and the cover film, and the second electrode and a conductive layer that is in the same layer as the second wiring line are electrically connected to each other through the slit, and the first lead wiring line that extends to the display area while intersecting with the conductive layer is connected to the second lead wiring line via a second wiring line contact part in a portion between the display area and the conductive layer.

In Aspect 7, the frame area is further provided with a folding part between the display area and the terminal unit, and a wiring line that intersects with the folding part is in the same layer as the second lead wiring line.

A manufacturing method of Aspect 8 for a display device including a first wiring line, an inorganic layer, a second wiring line, a flattening film, a first electrode, a cover film, a light emitting layer, a second electrode, and a sealing layer arranged in this order with the first wiring line being a bottom layer, the method including: a first wiring line forming step of forming the first wiring line and a first lead wiring line; a contact hole forming step of forming a first contact hole in the inorganic layer; a second wiring line forming step of forming the second wiring line and a second lead wiring line; a first electrode forming step of forming the first electrode for each of a plurality of pixels in a display area; a cover film forming step of forming the cover film having an opening at each of the plurality of pixels and forming a first bank; and a second electrode forming step of forming the second electrode common to the plurality of pixels, wherein the first contact hole is formed between an end portion of the flattening film and the first bank, and the first lead wiring line and the second lead wiring line are connected to each other through the first contact hole, the first bank surrounds the second electrode, the first lead wiring line extends from the display area to a frame area that surrounds the display area while intersecting with the end portion of the flattening film, and the second lead wiring line is in contact with and intersects with the first bank, and is connected to a terminal unit, at an end portion of the frame area, allowing a signal from external to be input to the display area.

In Aspect 9, a second bank is further formed in the cover film forming step, and the second bank surrounds the first bank, and the second lead wiring line extends to the terminal unit while intersecting with and being in contact with the second bank.

In Aspect 10, the cover film forming step includes forming the second bank to be more on a circumference side than the first bank and to have a higher height than the first bank.

In Aspect 11, the heights of the first bank and the second bank are set to be different from each other through a baking process after photolithography in the cover film forming step.

In Aspect 12, the cover film forming step includes forming the second bank to have a wider bank width than the first bank.

In Aspect 13, the second wiring line forming step includes forming the second lead wiring line that extends to the terminal unit while intersecting with the second bank, at a position to be overlapped by at least one of the first bank and the second bank before being connected to the terminal unit.

In Aspect 14, the cover film forming step includes forming a slit through the flattening film and the cover film, at an outer edge of the display area, the second electrode forming step includes electrically connecting the second electrode with a conductive layer that is in a same layer as the second wiring line through the slit, the contact hole forming step includes forming a second contact hole in the inorganic layer and between the display area and the conductive layer, the first lead wiring line extends to the display area while intersecting with the conductive layer, and the first lead wiring line and the second lead wiring line are connected to each other through the second contact hole.

In Aspect 15, a folding part forming step is further performed for forming a folding part between the display are and the terminal unit in the frame area, wherein the second wiring line forming step includes a wiring line that intersects with the folding part to be in a same layer as the second lead wiring line.

A manufacturing apparatus for a display device of Aspect 16 includes a film forming device configured to form a first wiring line, an inorganic layer, a second wiring line, a flattening film, first electrodes, a cover film, a light emitting layer, a second electrode, and a sealing layer arranged in this order with the first wiring line being a bottom layer, wherein the display device includes: a display area and a frame area surrounding the display area, the display device includes a terminal unit configured to allow a signal from external to be input to the display area at an end portion of the frame area, the display device includes a plurality of pixels at the display area and each of the first electrodes in each of the plurality of pixels, the cover film includes an opening formed at each of the first electrodes, the display device includes the second electrode common to the plurality of pixels, a first bank in a same layer as the cover film surrounds the second electrode, a lead wiring line extending from the display area to be electrically connected to the terminal unit includes a first lead wiring line in a same layer as the first wiring line and a second lead wiring line in a same layer as the second wiring line, and the first lead wiring line extends from the display area to the frame area while intersecting with an end portion of the flattening film and is reconnected to the second lead wiring line via a first wiring line contact part in a portion between the end portion of the flattening film and the first bank, and the second lead wiring line is in contact with the first bank and extends to the terminal unit while intersecting with the first bank.

The disclosure is not limited to each of the embodiments stated above, and various modifications may be implemented within a range not departing from the scope of the claims. Embodiments obtained by appropriately combining technical approaches stated in each of the different embodiments also fall within the scope of the technology of the disclosure. Moreover, novel technical features may be formed by combining the technical approaches stated in each of the embodiments.

REFERENCE SIGNS LIST

2 Display device
6 Sealing layer
16, 18, 20 Inorganic layer
21 Flattening film
22 Pixel electrode (first electrode)
23 Cover film
23a, 23c First bank
23b, 23d Second bank
24 Light emitting layer
25 Upper electrode (second electrode)
40 Terminal unit
41, 46 Wire contact part
42, 48 First contact hole
44, 45 Routed wiring line
47 Slit
50 Display device manufacturing apparatus
DA Display area
NA Frame area
SH Source wiring line (second wiring line)
GE Gate electrode (first wiring line)
F Folding part

The invention claimed is:

1. A display device comprising:
a first wiring line;
an inorganic layer;
a second wiring line;
a flattening film;
first electrodes;
a cover film;
a light emitting layer;
a second electrode; and
a sealing layer,
the first wiring line, the inorganic layer, the second wiring line, the flattening film, the first electrodes, the cover film, the light emitting layer, the second electrode, and the sealing layer being arranged in this order with the first wiring line being a bottom layer,
wherein the display device includes a display area and a frame area surrounding the display area,
the display device includes a terminal unit configured to allow a signal from external to be input to the display area at an end portion of the frame area,
the display device includes a plurality of pixels at the display area and each of the first electrodes in each of the plurality of pixels,
the cover film includes an opening formed at each of the first electrodes,
the display device includes the second electrode common to the plurality of pixels,
a first bank in a same layer as the cover film surrounds the second electrode,
a lead wiring line extending from the display area to be electrically connected to the terminal unit includes a first lead wiring line in a same layer as the first wiring line and a second lead wiring line in a same layer as the second wiring line, and
the first lead wiring line extends from the display area to the frame area while intersecting with an end portion of the flattening film and is connected to the second lead wiring line via a first wiring line contact part in a portion between the end portion of the flattening film and the first bank, and the second lead wiring line is in contact with the first bank and extends to the terminal unit while intersecting with the first bank.

2. The display device according to claim 1, further comprising:
a second bank in the same layer as the cover film,
wherein the second bank surrounds the first bank, and the second lead wiring line extends to the terminal unit while intersecting with and being in contact with the second bank.

3. The display device according to claim 2,
wherein the second bank has a height higher than a height of the first bank.

4. The display device according to claim 2,
wherein the second bank has a bank width that is wider than a bank width of the first bank.

5. The display device according to claim 2,
wherein the second lead wiring line that extends to the terminal unit while intersecting with the second bank is overlapped by at least one of the first bank and the second bank before being connected to the terminal unit.

6. The display device according to claim 1,
wherein the display area has an outer edge provided with a slit formed in the flattening film and the cover film, and the second electrode and a conductive layer that is in the same layer as the second wiring line are electrically connected to each other through the slit, and
the first lead wiring line that extends to the display area while intersecting with the conductive layer is connected to the second lead wiring line via a second wiring line contact part in a portion between the display area and the conductive layer.

7. The display device according to claim 1,
wherein the frame area is further provided with a folding part between the display area and the terminal unit, and a wiring line that intersects with the folding part is in the same layer as the second lead wiring line.

8. A manufacturing method for a display device including a first wiring line, an inorganic layer, a second wiring line, a flattening film, a first electrode, a cover film, a light emitting layer, a second electrode, and a sealing layer arranged in this order with the first wiring line being a bottom layer, the method comprising:
- a first wiring line forming step of forming the first wiring line and a first lead wiring line;
- a contact hole forming step of forming a first contact hole in the inorganic layer;
- a second wiring line forming step of forming the second wiring line and a second lead wiring line;
- a first electrode forming step of forming the first electrode for each of a plurality of pixels in a display area;
- a cover film forming step of forming the cover film having an opening at each of the plurality of pixels and forming a first bank; and
- a second electrode forming step of forming the second electrode common to the plurality of pixels,
- wherein the first contact hole is formed between an end portion of the flattening film and the first bank, and the first lead wiring line and the second lead wiring line are connected to each other through the first contact hole,
- the first bank surrounds the second electrode,
- the first lead wiring line extends from the display area to a frame area that surrounds the display area while intersecting with the end portion of the flattening film, and
- the second lead wiring line is in contact with and intersects with the first bank, and is connected to a terminal unit, at an end portion of the frame area, allowing a signal from external to be input to the display area.

9. The manufacturing method for a display device according to claim 8,
- wherein a second bank is further formed in the cover film forming step, and the second bank surrounds the first bank, and the second lead wiring line extends to the terminal unit while intersecting with and being in contact with the second bank.

10. The manufacturing method for a display device according to claim 9,
- wherein the cover film forming step includes forming the second bank to be more on a circumference side than the first bank and to have a higher height than the first bank.

11. The manufacturing method for a display device according to claim 10,
- wherein the heights of the first bank and the second bank are set to be different from each other through a baking process after photolithography in the cover film forming step.

12. The manufacturing method for a display device according to claim 9,
- wherein the cover film forming step includes forming the second bank to have a wider bank width than the first bank.

13. The manufacturing method for a display device according to claim 9,
- wherein the second wiring line forming step includes forming the second lead wiring line that extends to the terminal unit while intersecting with the second bank, at a position to be overlapped by at least one of the first bank and the second bank before being connected to the terminal unit.

14. The manufacturing method for a display device according to claim 8,
- wherein the cover film forming step includes forming a slit through the flattening film and the cover film, at an outer edge of the display area,
- the second electrode forming step includes electrically connecting the second electrode with a conductive layer that is in a same layer as the second wiring line through the slit,
- the contact hole forming step includes forming a second contact hole in the inorganic layer and between the display area and the conductive layer,
- the first lead wiring line extends to the display area while intersecting with the conductive layer, and
- the first lead wiring line and the second lead wiring line are connected to each other through the second contact hole.

15. The manufacturing method for a display device according to claim 8, further comprising:
- a folding part forming step of further forming a folding part between the display are and the terminal unit in the frame area,
- wherein the second wiring line forming step includes a wiring line that intersects with the folding part to be in a same layer as the second lead wiring line.

16. A manufacturing apparatus for a display device, comprising:
- a film forming device configured to form a first wiring line, an inorganic layer, a second wiring line, a flattening film, first electrodes, a cover film, a light emitting layer, a second electrode, and a sealing layer arranged in this order with the first wiring line being a bottom layer,
- wherein the display device includes a display area and a frame area surrounding the display area,
- the display device includes a terminal unit configured to allow a signal from external to be input to the display area at an end portion of the frame area,
- the display device includes a plurality of pixels at the display area and each of the first electrodes in each of the plurality of pixels,
- the cover film includes an opening formed at each of the first electrodes,
- the display device includes the second electrode common to the plurality of pixels,
- a first bank in a same layer as the cover film surrounds the second electrode,
- a lead wiring line extending from the display area to be electrically connected to the terminal unit includes a first lead wiring line in a same layer as the first wiring line and a second lead wiring line in a same layer as the second wiring line, and
- the first lead wiring line extends from the display area to the frame area while intersecting with an end portion of the flattening film and is reconnected to the second lead wiring line via a first wiring line contact part in a portion between the end portion of the flattening film and the first bank, and the second lead wiring line is in contact with the first bank and extends to the terminal unit while intersecting with the first bank.

* * * * *